United States Patent
Han

(10) Patent No.: US 10,217,787 B2
(45) Date of Patent: Feb. 26, 2019

(54) BACKSIDE ILLUMINATED IMAGE SENSOR AND METHOD OF MANUFACTURING THE SAME

(71) Applicant: DONGBU HITEK CO., LTD., Seoul (KR)

(72) Inventor: Chang Hun Han, Gyeonggi-do (KR)

(73) Assignee: DB Hitek Co., Ltd., Seoul (KR)

( * ) Notice: Subject to any disclaimer, the term of this patent is extended or adjusted under 35 U.S.C. 154(b) by 0 days.

(21) Appl. No.: 15/698,073

(22) Filed: Sep. 7, 2017

(65) Prior Publication Data

US 2018/0069039 A1    Mar. 8, 2018

(30) Foreign Application Priority Data

Sep. 7, 2016    (KR) .................. 10-2016-0115029

(51) Int. Cl.
*H01L 27/00*    (2006.01)
*H01L 27/146*    (2006.01)

(52) U.S. Cl.
CPC .... *H01L 27/1464* (2013.01); *H01L 27/14621* (2013.01); *H01L 27/14627* (2013.01); *H01L 27/14687* (2013.01)

(58) Field of Classification Search
CPC .................................................. H01L 27/1464
See application file for complete search history.

(56) References Cited

U.S. PATENT DOCUMENTS

| 6,026,964 | A | 2/2000 | Hook et al. |
| 7,154,137 | B2 | 12/2006 | Nozaki |
| 8,836,068 | B2 | 9/2014 | Kwon |
| 2011/0024867 | A1* | 2/2011 | Tseng ............... H01L 24/05 257/459 |
| 2012/0313208 | A1 | 12/2012 | Kim et al. |
| 2013/0140663 | A1 | 6/2013 | Fukuda |
| 2017/0170228 | A1 | 6/2017 | Yeo |
| 2017/0229497 | A1 | 8/2017 | Han |

FOREIGN PATENT DOCUMENTS

| KR | 20110129138 A | 12/2011 |
| KR | 20120135627 A | 12/2012 |

* cited by examiner

*Primary Examiner* — William Harriston
(74) *Attorney, Agent, or Firm* — Patterson Thuente Pederson, P.A.

(57) ABSTRACT

A backside illuminated image sensor includes a photodiode arranged in a substrate, a first insulating layer arranged on a front surface of the substrate, a bonding pad arranged on the first insulating layer, and a second insulating layer arranged on the first insulating layer and the bonding pad. The bonding pad is partially exposed by an opening passing through the substrate and the first insulating layer, and an edge portion of the bonding pad is supported by the first and second insulating layers.

17 Claims, 16 Drawing Sheets

BACKSIDE ILLUMINATED IMAGE SENSOR AND METHOD OF MANUFACTURING THE SAME

CROSS-REFERENCE TO RELATED APPLICATION

This application claims the priority benefit of Korean Patent Application No. 10-2016-0115029, filed on Sep. 7, 2016, and all the benefits accruing therefrom under 35 U.S.C. § 119, the contents of which are incorporated by reference in their entirety.

TECHNICAL FIELD

The present disclosure relates to a generally to the field of image sensors and in particular to the field of backside illuminated image sensors a methods of manufacturing the same.

BACKGROUND

The present disclosure relates to a backside illuminated image sensor and a method of manufacturing the same.

An image sensor is a semiconductor device that converts an optical image into electrical signals. Image sensors known in the art include charge coupled devices (CCDs) and CMOS image sensors.

CMOS image sensors include unit pixels, each including a photodiode and metal-oxide-semiconductor (MOS) transistors. CMOS image sensors can sequentially detect the electrical signals of the unit pixels using a switching method in order to form an image. CMOS image sensors can be front side illuminated image sensors or backside illuminated image sensors.

A front side illuminated (or front-illuminated) image sensor may include photodiodes formed in a substrate, transistors formed on a front surface of the substrate, wiring layers formed on the front surface of the substrate, and a color filter layer and micro lens array formed on the wiring layers.

In contrast, a backside illuminated (or back-illuminated) sensor can arrange the wiring behind the photodiode layer. Backside illuminated image sensor therefore have an improved light-receiving efficiency in comparison with front side illuminated image sensors. Backside illuminated image sensors can, however, be more difficult to manufacture, resulting in lower yields and higher prices.

One manufacturing difficulty can result from a bonding pad formed on an insulating layer. The bonding pad may be connected with the wiring layers on the front surface of the substrate by a contact passing through the substrate and the insulating layer. However, when the bonding pad has a relatively thin thickness, the bonding pad may be damaged or peeled away from the substrate during the wire bonding process.

SUMMARY

The present disclosure provides a backside illuminated image sensor having an improved bonding pad and a method of manufacturing the backside illuminated image sensor.

In accordance with an aspect of the present disclosure, a backside illuminated image sensor may include a photodiode disposed in a substrate having a front surface and a back surface, a first insulating layer disposed on a front surface of the substrate, and a first bonding pad disposed on first the insulating layer. The substrate and the first insulating layer can comprise structures defining an opening extending from the front surface of the substrate to a back surface of the first bonding pad such that the back surface of the first bonding pad is partially exposed by the opening.

In accordance with some exemplary embodiments, the backside illuminated image sensor may further include a metal wiring layer disposed on the insulating layer, and the bonding pad may be made of the same material as the metal wiring layer.

In accordance with some exemplary embodiments, the backside illuminated image sensor may further include a second insulating layer disposed on the insulating layer, the bonding pad and the metal wiring layer. The second insulating layer can have an aperture extending from a front surface of the second insulating layer to the first bonding pad, such that a portion of a front surface of the first bonding pad is exposed. A second bonding pad can be disposed in part on the portion of the front surface of the first bonding pad exposed by the aperture of the second insulating layer, and in part on the front surface of second insulating layer.

In accordance with some exemplary embodiments, an edge portion of the first bonding pad may be disposed between the first insulating layer and the second insulating layer.

In accordance with some exemplary embodiments, the backside illuminated image sensor may further include a second metal wiring layer disposed on the front surface second insulating layer, and the second bonding pad may comprise the same material as the second metal wiring layer.

In accordance with some exemplary embodiments, the backside illuminated image sensor may further include a third insulating layer disposed on the second insulating layer, the second bonding pad and the second metal wiring layer. The third insulating layer can have a third an aperture extending from a front surface of the third insulating layer to the second bonding pad, such that a portion of a front surface of the second bonding pad is exposed. A third bonding pad can be disposed in part on the portion of the second bonding pad exposed by the aperture of the third insulating layer and in part on the front surface of third insulating layer.

In accordance with some exemplary embodiments, the backside illuminated image sensor may further include a third metal wiring layer disposed on the third insulating layer, and a fourth insulating layer disposed on the third insulating layer, the third bonding pad and the third metal wiring layer. The third bonding pad can comprise the same material as the third metal wiring layer.

In accordance with some exemplary embodiments, the substrate may have a first conductivity type, the photodiode may have a second conductivity type, and a front pinning layer having the first conductivity type may be disposed between the front surface of the substrate and the photodiode.

In accordance with some exemplary embodiments, a backside pinning layer having the first conductivity type may be disposed between a back surface of the substrate and the photodiode.

In accordance with some exemplary embodiments, the backside illuminated image sensor may further include a color filter disposed on a back surface of the substrate and a micro lens disposed on the color filter.

In accordance with some exemplary embodiments, the backside illuminated image sensor may further an anti-reflective layer disposed on the back surface of the substrate, a light-blocking pattern disposed on the anti-reflective layer, a passivation layer disposed on the anti-reflective layer and the light-blocking pattern, a color filter disposed on a back surface of the passivation layer, and a micro lens disposed on the color filter. Each of the anti-reflective layer, the light-blocking pattern, the passivation layer, the color filter, and the micro lens may comprise structures defining an aperture extending from a front surface of the micro lens to a back surface of the anti-reflective layer. The aperture may be aligned with the opening such that the back surface of the first bonding pad is partially exposed by the opening and the aperture.

In accordance with some exemplary embodiments, the backside illuminated image sensor may further include a fifth insulating layer disposed between the color filter and the passivation layer.

In accordance with another aspect of the present disclosure, a method of manufacturing a backside illuminated image sensor may include forming a photodiode in a substrate, forming an insulating layer on a front surface of the substrate, forming a bonding pad on the insulating layer, and forming an opening passing through the substrate and the insulating such that a portion of the first bonding pad is exposed.

In accordance with some exemplary embodiments, the method may further include forming a metal wiring layer on the insulating layer, and the bonding pad may be simultaneously formed with the metal wiring layer.

In accordance with some exemplary embodiments, the method may further include forming a second insulating layer on the insulating layer, the bonding pad and the metal wiring layer, forming an aperture through the second insulating layer such that a portion of the first bonding pad is partially exposed, forming a second bonding pad in part on the exposed portion of the bonding pad and in part on the second insulating layer, and forming a second metal wiring layer on the second insulating layer.

In accordance with some exemplary embodiments, the method may further include forming a third insulating layer on the second insulating layer, the second bonding pad and the second metal wiring layer, forming an aperture through the third insulating layer such that a portion of the second bonding pad is exposed, forming a third bonding pad in part on the exposed portion of the second bonding pad and in part on the third insulating layer, and forming a third metal wiring layer on the third insulating layer.

In accordance with some exemplary embodiments, the method may further include forming an anti-reflective layer on a back surface of the substrate, forming a light-blocking pattern on the anti-reflective layer, forming a passivation layer on the anti-reflective layer and the light-blocking pattern, and removing a portion of the anti-reflective layer and the passivation layer such that the back surface of the first bonding pad is partially exposed.

In accordance with some exemplary embodiments, the method may further include forming a protective layer on the passivation layer, the inner surfaces of the opening and the exposed portion of the first bonding pad.

In accordance with some exemplary embodiments, the method may further include forming a color filter on the protective layer, forming a micro lens on the color filter, and removing a portion of the protective layer to expose the portion of the first bonding pad through the opening.

In accordance with some exemplary embodiments, the opening may be formed through the passivation layer and the anti-reflective layer after forming the micro lens. In such a case, the step of forming the protective layer may be omitted.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Exemplary embodiments can be understood in more detail from the following description taken in conjunction with the accompanying drawings, in which.

Figure 1:
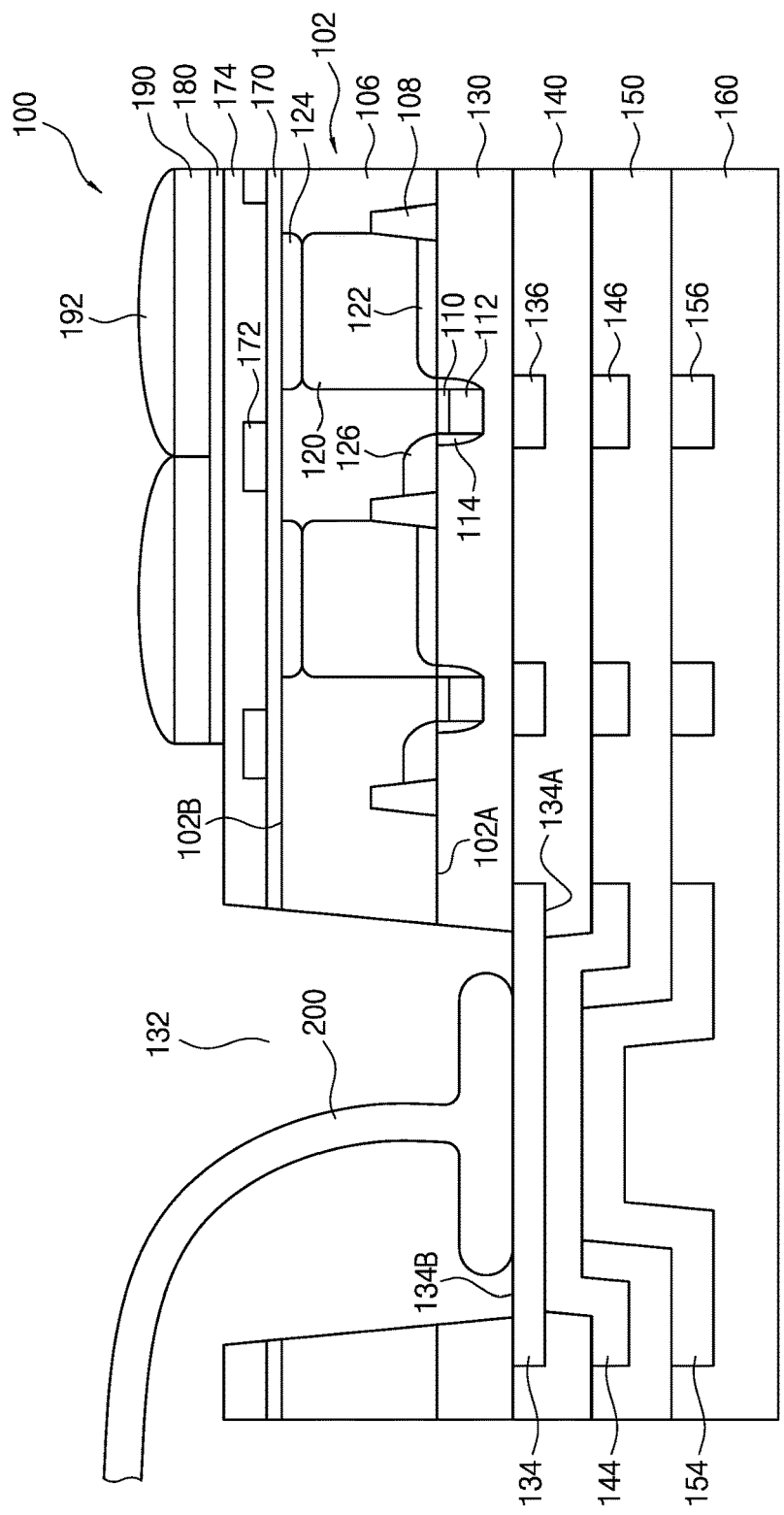
FIG. 1 is a cross-sectional view depicting a backside illuminated image sensor in accordance with an exemplary embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF THE DRAWINGS

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the present disclosure, when one component is referred to as being on or connected to another component or layer, it can be directly on or connected to the other component or layer, or an intervening component or layer may also be present. In contrast, it will be understood that when one component is referred to as directly being on or directly connected to another component or layer, it means that no intervening component is present. In addition, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not limited to the specific forms or areas in the drawings, and include deviations of the forms that would be understood by those of ordinary skill in the art. The depictions in the drawings may be entirely schematic, and their dimensions may not describe or depict accurate forms or structures in any given area, and are not intended to limit the scope of the present invention.

FIG. 1 is a cross-sectional view illustrating a backside illuminated image sensor 100 in accordance with an exemplary embodiment of the present disclosure.

Referring to FIG. 1, in accordance with an exemplary embodiment of the present disclosure, a backside illuminated image sensor 100 may include a photodiode 120 arranged in a substrate 102 and functioning as a charge accumulation region, a first insulating layer 130 arranged on a front surface 102A of the substrate 102, and a first bonding pad 134 arranged on the first insulating layer 130. The first bonding pad 134 may be exposed by a first opening 132 defined by apertures within the substrate 102 and the first insulating layer 130.

Particularly, the first opening 132 may partially expose a back surface 134B of the first bonding pad 134 and may have a smaller cross-sectional area than the back surface 134B of the first bonding pad 134. For example, the first bonding pad 134 may have a width of about 40 µm to about 120 µm, and the first opening 132 may have a width of about 50% to about 90% of the first bonding pad 134 and a depth of about 2 µm to about 4 µm.

The substrate 102 and the photodiode 120 can comprise materials with differing conductivity types. In an embodiment, the substrate 102 can comprise materials having a first conductivity type, such as p-type materials. For example, the substrate 102 may comprise a p-type epitaxial layer 106. Alternatively, the substrate 102 can entirely comprise a p-type substrate.

The photodiode 120 may comprise materials having a second conductivity type. For example, the photodiode 120 may be an n-type impurity region formed in the substrate 120.

A front pinning layer 122 having the same conductivity type as the substrate may be arranged between the front surface 102A of the substrate 102 and the photodiode 120, and a back pinning layer 124 having the same conductivity type as the substrate may be arranged between a back surface 102B of the substrate 102 and the photodiode 120. For example, the front and back pinning layers 122 and 124 may be p-type impurity regions.

A highly doped region 126 may be arranged within the substrate 102, such that a front surface of the highly doped region 126 is aligned with the front surface 102A of the substrate 102. The highly doped region 126 may be spaced apart from photodiode 120. In embodiments, the highly doped region 126 may comprise an n-type high impurity concentration region.

A gate structure may be arranged on the front surface 102A of the substrate 102. The gate structure may be disposed on the front surface 102A of the substrate 102 in the spaces between the photodiode 120 and the highly doped region 126. The gate structure may comprise a gate insulating layer 110 arranged on the front surface 102A of the substrate 102, a gate electrode 112 arranged on the gate insulating layer 110, and gate spacers 114 arranged on side surfaces of the gate electrode 112.

The highly doped region 126 may be used as a floating diffusion region if the backside illuminated image sensor 100 comprises a 4T (or more than four transistors) layout. If the backside illuminated image sensor 100 comprises a 3T (or fewer than three transistors) layout, the highly doped region 126 can be an active region for connecting the photodiode 120 with reset circuitry. Further, the gate electrode 112 may be used as a transfer gate electrode if the backside illuminated image sensor 100 comprises a 4T layout or a reset gate electrode if the backside illuminated image sensor 100 comprises a 3T layout.

A first metal wiring layer 136 may be arranged on the first insulating layer 130. The first metal wiring layer 136 can be electrically connected with the photodiode 120, and can comprise the same material as the first bonding pad 134.

Figure 6:
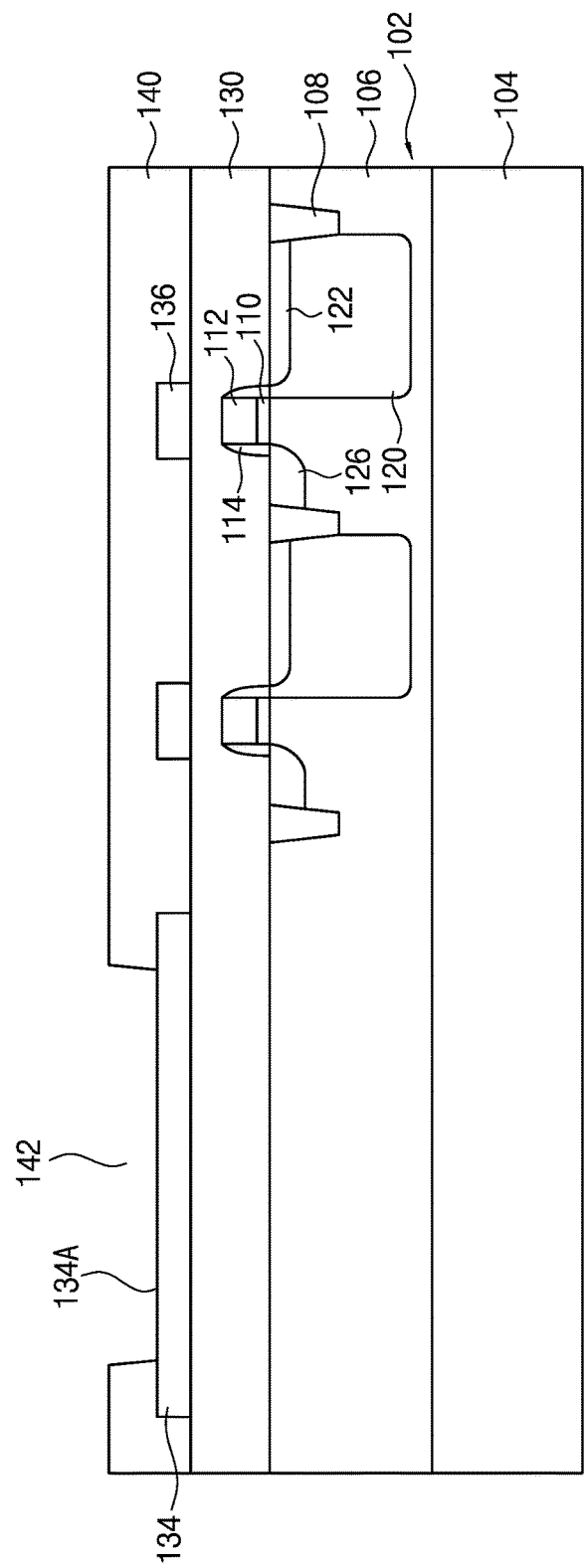

A second insulating layer 140 may be arranged on the first insulating layer 130, the first bonding pad 134 and the first metal wiring layer 136 and may have a second opening 142 (as depicted in FIG. 6) to partially expose a front surface 134A of the first bonding pad 134. A second bonding pad 144 may be arranged on a portion of the first bonding pad 134 exposed by the second opening 142 and the second insulating layer 140. Further, a second metal wiring layer 146 may be arranged on the second insulating layer 140 and may be made of the same material as the second bonding pad 144.

Figure 8:
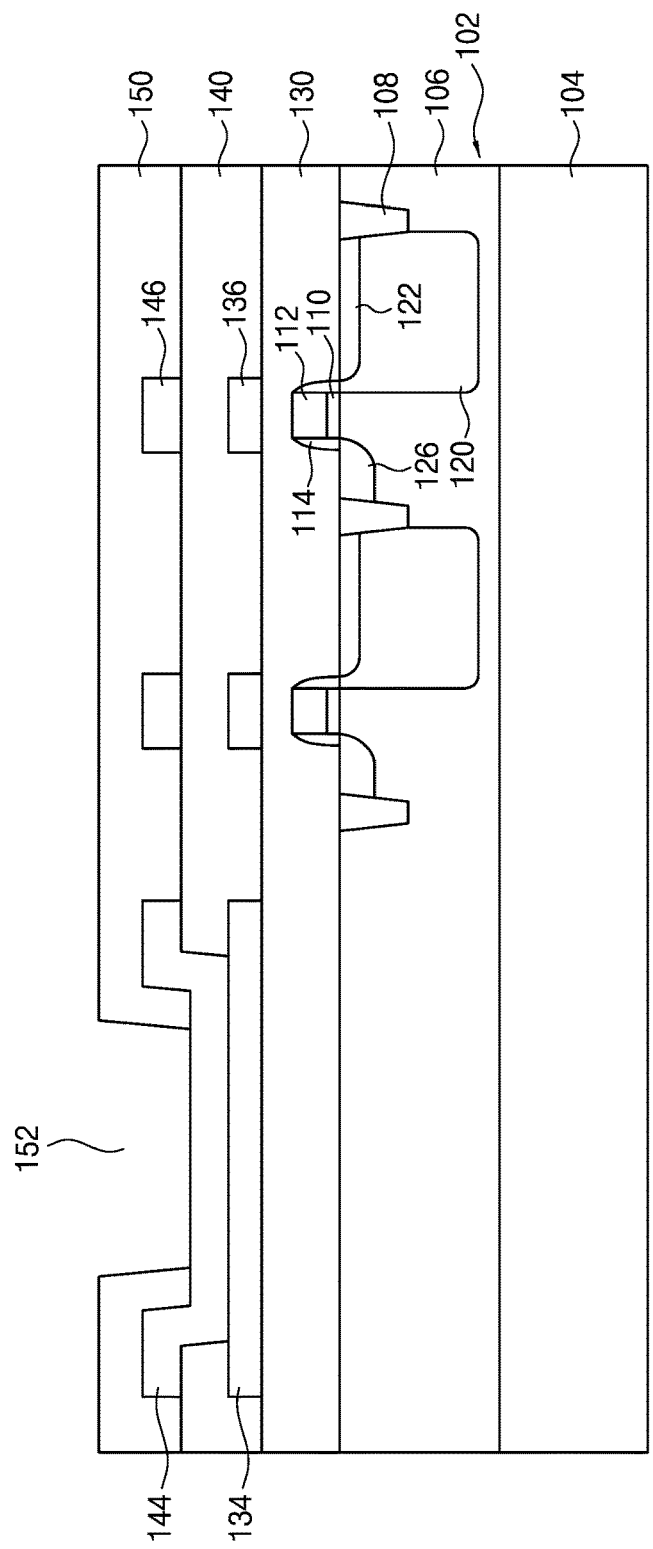

A third insulating layer 150 may be arranged on the second insulating layer 140, the second bonding pad 144 and the second metal wiring layer 146 and may have a third opening 152 (as depicted in FIG. 8) to partially expose the second bonding pad 144. A third bonding pad 154 may be arranged on the portion of the second bonding pad 144 exposed by the third opening 152 and the third insulating layer 150. Further, a third metal wiring layer 156 may be arranged on the third insulating layer 150 and may be made of the same material as the third bonding pad 154.

A fourth insulating layer 160 may be formed on the third insulating layer 150, the third bonding pad 154, and the third metal wiring layer 156.

In various embodiments, the first, second, third and fourth insulating layers 130, 140, 150 and 160 may comprise a silicon oxide, and the first, second and third bonding pads 134, 144 and 154 and the first, second and third metal wiring layers 136, 146 and 156 may comprise a metal such as aluminum (Al), copper (Cu), and the like. The first bonding pad 134 may have a relatively thick thickness as compared with the conventional art. For example, the first bonding pad 134 may have a thickness of about 1500 Å to about 2500 Å, the second bonding pad 144 may have a thickness of about 2000 Å to about 3500 Å, and the third bonding pad 154 may have a thickness of about 4000 Å to about 6000 Å.

An anti-reflective layer 170 may be arranged on the back surface 102B of the substrate 102. In an embodiment, the anti-reflective layer 170 may be made of a silicon nitride. A light-blocking pattern 172 may be formed on the anti-reflective layer 170. Light-blocking pattern 172 may reduce the cross-talk of the backside illuminated image sensor 100. A passivation layer 174 may be arranged on the anti-reflective layer 170 and the light-blocking pattern 172.

Each of the passivation layer 174, the anti-reflective layer 170, the substrate 102 and the first insulating layer 130 may comprise structures defining apertures, such that the first opening 132 passes through the layers, and the back surface 134B of the first bonding pad 134 is partially exposed.

A fifth insulating layer 180 may be arranged on the passivation layer 174. In embodiments, the fifth insulating layer 180 may be made of a silicon oxide, a silicon nitride, a silicon oxynitride, and the like.

A color filter 190 may be arranged on the fifth insulating layer 180, and a micro lens 192 may be arranged on the color filter 190. The fifth insulating layer 180 may function as a protective layer that can protect the first bonding pad during formation of the color filter 190 and the microlens 192.

The fifth insulating layer 180 may be conformally formed on the passivation layer 174, inner surfaces of the first opening 132 and the portion of the first bonding pad 134 exposed by the first opening 132, and may function as a protective layer for protecting the first bonding pad 134 while forming the color filter 190 and the micro lens 192. Further, after forming the color filter 190 and the micro lens 192, a portion of the fifth insulating layer 180 may be removed so that the first bonding pad 134 is partially exposed by the first opening 132.

A wire 200 may be bonded to the first bonding pad 134 through the first opening 132. Alternatively, a solder ball or a solder bump may be arranged on the back portion of the bonding pad 134 exposed by the first opening 132.

In accordance with the present exemplary embodiment, the first opening 132 may have a cross sectional area that is smaller than the back surface of the first bonding pad 134. As a result, an edge portion of the first bonding pad 134 may be disposed between the first and second insulating layers 130 and 140, and thus the first bonding pad 134 may be stably maintained by the first and second insulating layers 130 and 140.

Further, an edge portion of the second bonding pad 144 may be disposed between the second and third insulating layers 140 and 150, and an edge portion of the third bonding pad 154 may be disposed between the third and fourth insulating layers 150 and 160. As a result, the first, second and third bonding pads 134, 144 and 154 may be strongly supported by the first, second, third and fourth insulating layers 130, 140, 150 and 160, and thus the first bonding pad 134 may be inhibited from being damaged or peeled away from the substrate 102 during the wire bonding process.

Figure 2:
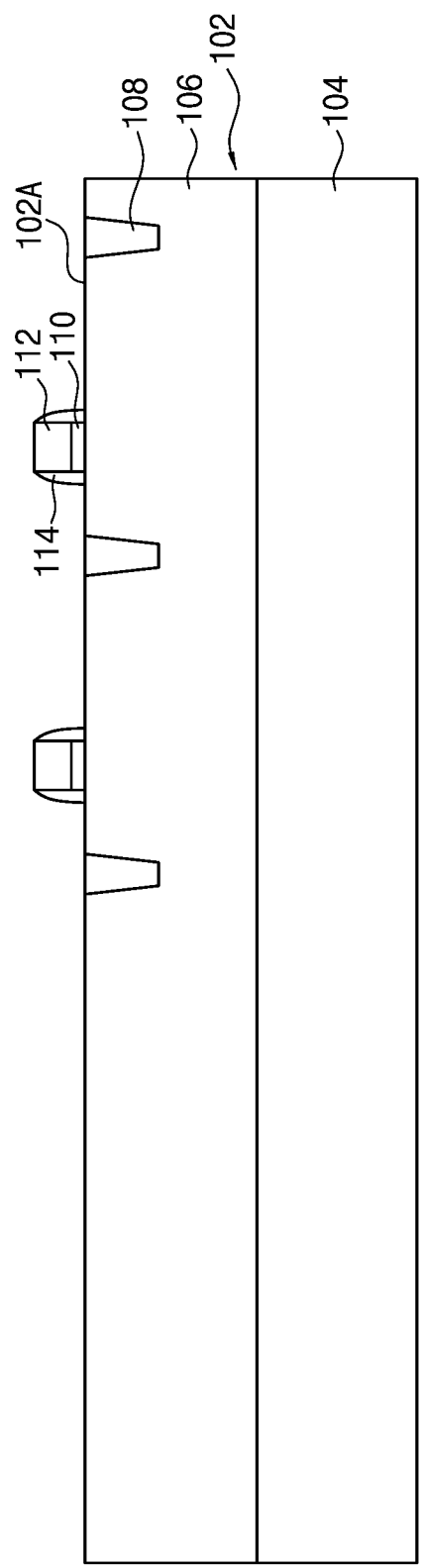
FIGS. 2 to 16 are cross-sectional views depicting a backside illuminated image sensor as shown in FIG. 1 during various phase of a method of manufacturing the same, in accordance with an exemplary embodiment of the present disclosure.

As can be seen in FIG. 2, device isolation regions 108 may be arranged in front surface portions of a substrate 102 to define an active region of the backside illuminated image sensor 100. The substrate 102 may include a bulk silicon substrate 104 and an epitaxial region 106 of a first conductivity type formed on the bulk silicon substrate 104. For example, the substrate 102 may include a p-type epitaxial region 106. Alternatively, a p-type substrate may be used as the substrate 102.

FIGS. 2 to 16 are cross-sectional views depicting various phases of a method of manufacturing the backside illuminated image sensor 100 depicted in FIG. 1. Referring again to FIG. 2, the device isolation regions 108, which may be made of a silicon oxide, may be formed by a shallow trench isolation (STI) process. For example, shallow trenches may be formed in the front surface portions of the substrate 102 and then filled with the silicon oxide thereby forming the device isolation regions 108.

The gate insulating layer 110 and the gate electrode 112 may be formed on a front surface 102A of the substrate 102, and the gate spacers 114 may be formed on side surfaces of the gate electrode 112. Further, a source follower gate, a select gate, and/or the like may be simultaneously formed with the gate electrode 112 on the front surface 102A of the substrate 102.

Figure 3:
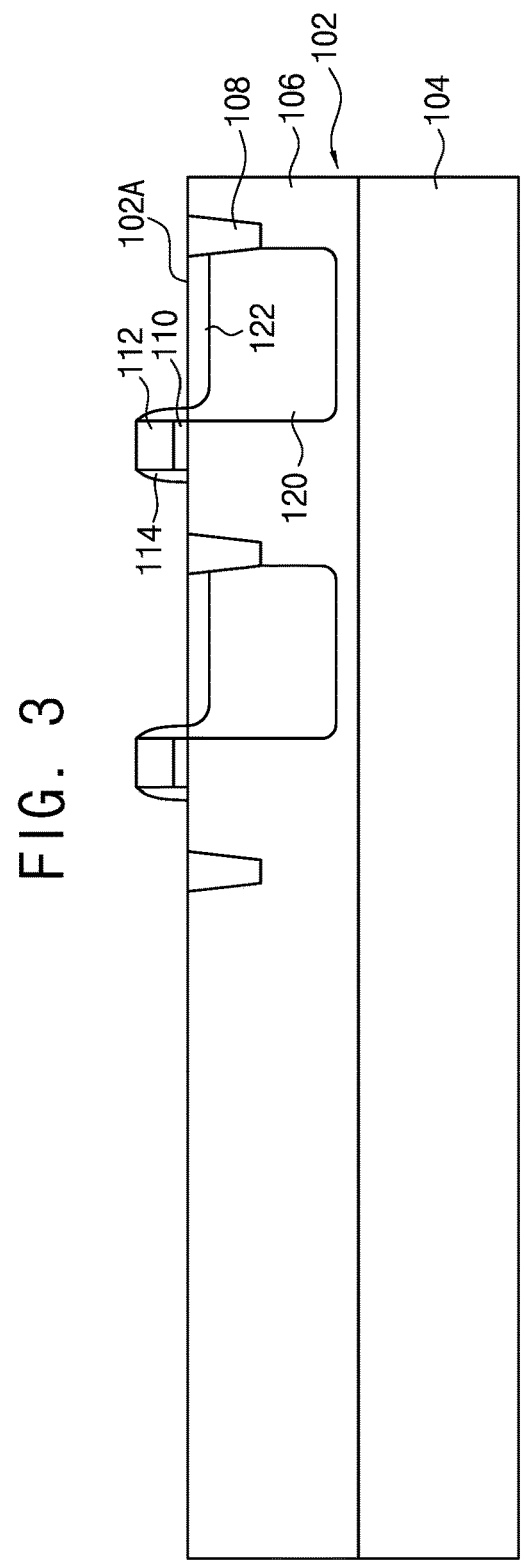

Referring to FIG. 3, the photodiode 120 may be formed in the substrate 102. In one embodiment, photodiode 120 may comprise an n-type impurity region formed in the p-type epitaxial layer 106 by an ion implantation process. Then, the front pinning layer 122 may be formed between the front surface 102A of the substrate 102 and the photodiode 120. In one embodiment, the front pinning layer 122 may comprise a p-type impurity region may be formed by an ion implantation process. The n-type photodiode 120 and the p-type front pinning layer 122 may be activated by a rapid heat treatment process.

Figure 4:
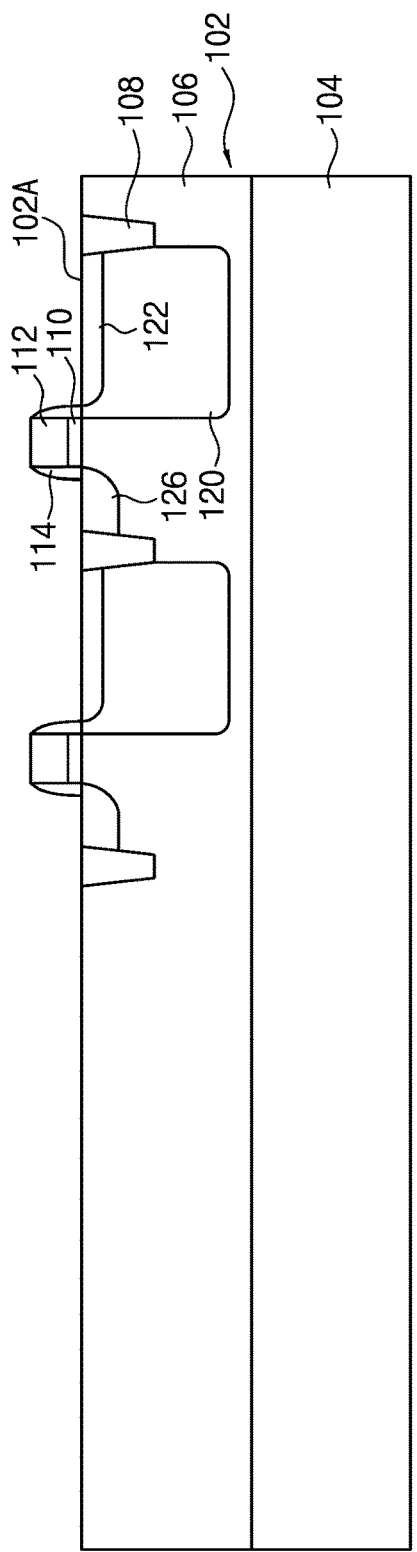

Referring to FIG. 4, a highly doped region 126 having the second conductivity type may be formed in a front portion of the substrate 102, spaced apart from the photodiode 120. In an embodiment, highly doped region 126 can comprise an n-type region formed in the front portion of the substrate 102 by an ion implantation process. The highly doped region 126 may function as a floating diffusion region 4T embodiments and as a active region for connecting the photodiode 120 with a reset circuitry in 3T embodiments.

The gate electrode 112 may be formed on the front surface 102A of the substrate 102 between the photodiode 120 and the high concentration impurity region 126.

Figure 5:
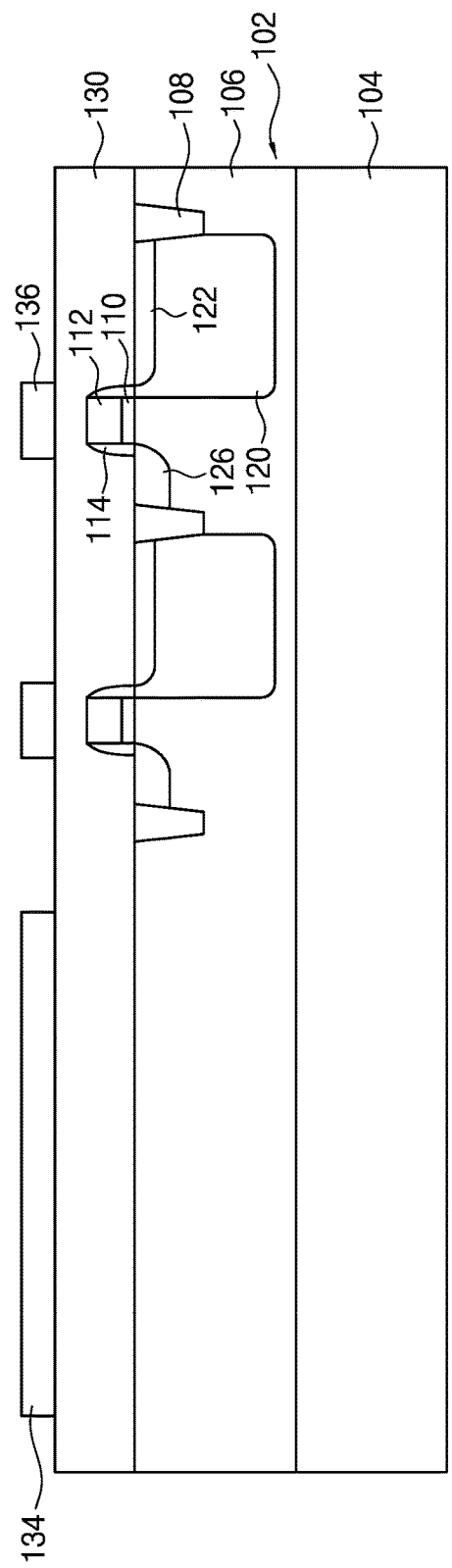

Referring to FIG. 5, the first insulating layer 130 may be formed on the front surface 102A of the substrate 102. The first bonding pad 134 and the first metal wiring layer 136 may then be formed on the first insulating layer 130. The first insulating layer 130 may be made of a silicon oxide, and first the bonding pad 134 and the first metal wiring layer 136 are made of a conductive metal such as aluminum (Al), copper (Cu), or the like. In embodiments, the first bonding pad 134 may be simultaneously formed with the first metal wiring layer 136. For example, a first metal layer (not shown) may be formed on the first insulating layer 130 and then patterned to form the first bonding pad 134 and the first metal wiring layer 136.

Referring to FIG. 6, the second insulating layer 140 may be formed on the first insulating layer 130, the first bonding pad 134 and the first metal wiring layer 136. Then, a second opening 142 may be formed by patterning the second insulating layer 140 to partially expose a front surface 134A of the first bonding pad 134. The partial exposure of the front surface 134A of the first bonding pad 134 may leave an edge portion arranged between the first and second insulating layers 130 and 140. Thus, the first bonding pad 134 may be stably supported by the first and second insulating layers 130 and 140.

Figure 7:
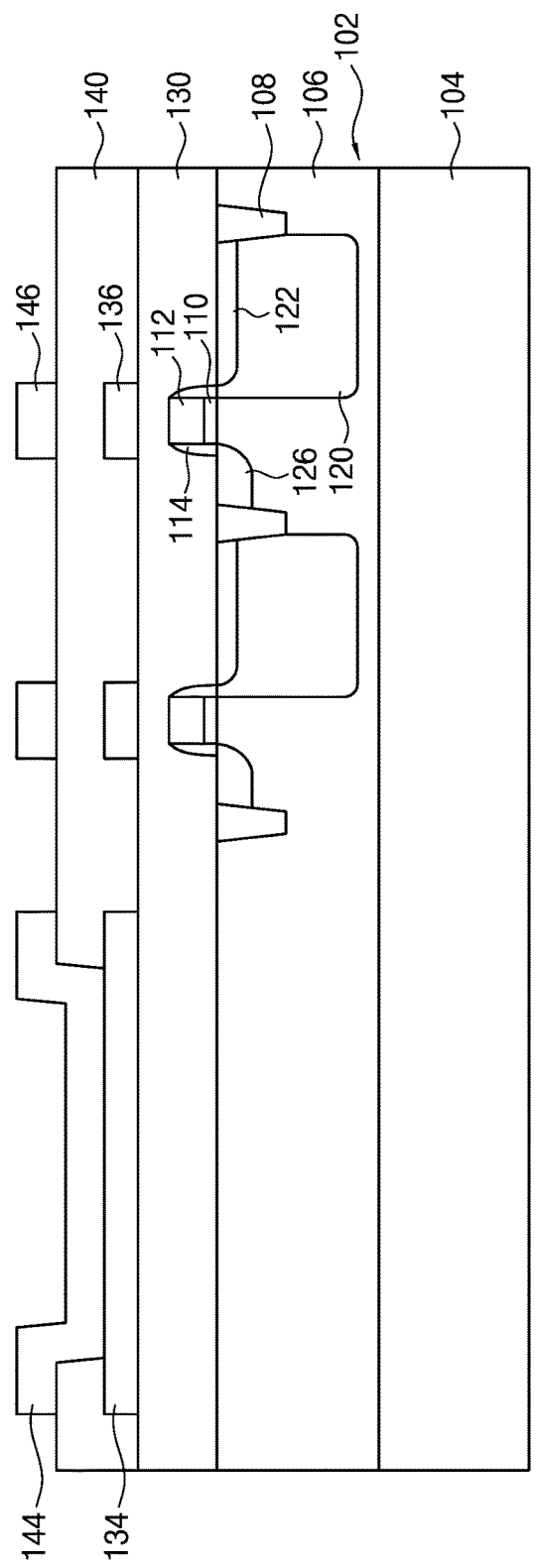

Referring to FIG. 7, a second bonding pad 144 may be formed on the portion of the first bonding pad 134 that is exposed by the second opening 142 and the second insulating layer 140. Further, a second metal wiring layer 146 may be formed on the second insulating layer 140. The second bonding pad 144 may be simultaneously formed with the second metal wiring layer 146. For example, a second metal layer (not shown) may be formed on the second insulating layer 140, the inner surfaces of the second opening 142, and the portion of the first bonding pad 134 exposed by the second opening 142. The metal layer may then be patterned so as to form the second bonding pad 144 and the second metal wiring layer 146. An edge portion of the second bonding pad 144 may be disposed on the second insulating layer 140.

Referring to FIG. 8, a third insulating layer 150 may be formed on the second insulating layer 140, the second bonding pad 144 and the second metal wiring layer 146. Then, a third opening 152 may be formed by patterning the third insulating layer 150 so as to partially expose the second bonding pad 144. An edge portion of the second bonding pad 144, i.e., a remaining portion except a portion of the second bonding pad 144 exposed by the third opening 152 may be disposed between the second and third insulating layers 140 and 150. Thus, the second bonding pad 144 may be stably supported by the second and third insulating layers 140 and 150.

Figure 9:
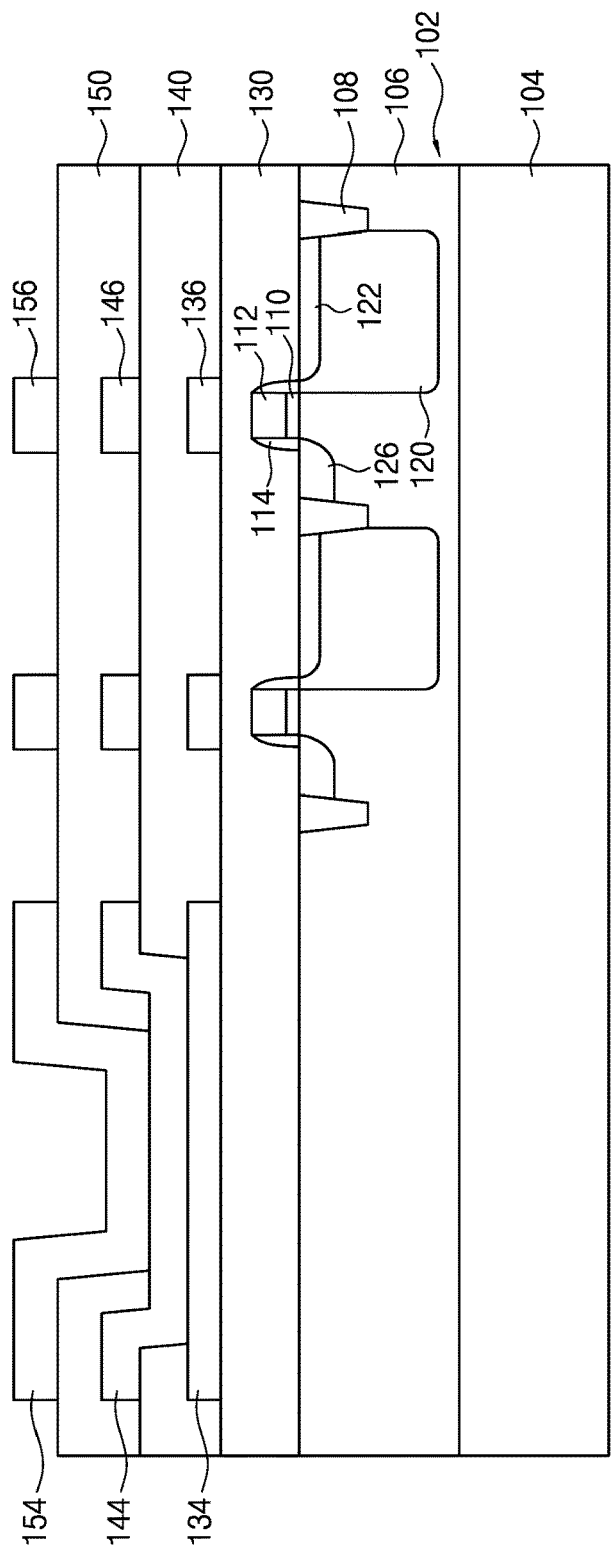

Referring to FIG. 9, a third bonding pad 154 may be formed on the portion of the second bonding pad 144 exposed by the third opening 152 and the third insulating layer 150. Further, a third metal wiring layer 156 may be formed on the third insulating layer 150. The third bonding pad 154 may be simultaneously formed with the third metal wiring layer 156. For example, a third metal layer (not shown) may be formed on the third insulating layer 150, inner surfaces of the third opening 152 and the portion of the second bonding pad 144 exposed by the third opening 152, and may then be patterned so as to form the third bonding pad 154 and the third metal wiring layer 156. An edge portion of the third bonding pad 154 may be disposed on the third insulating layer 150.

Figure 10:
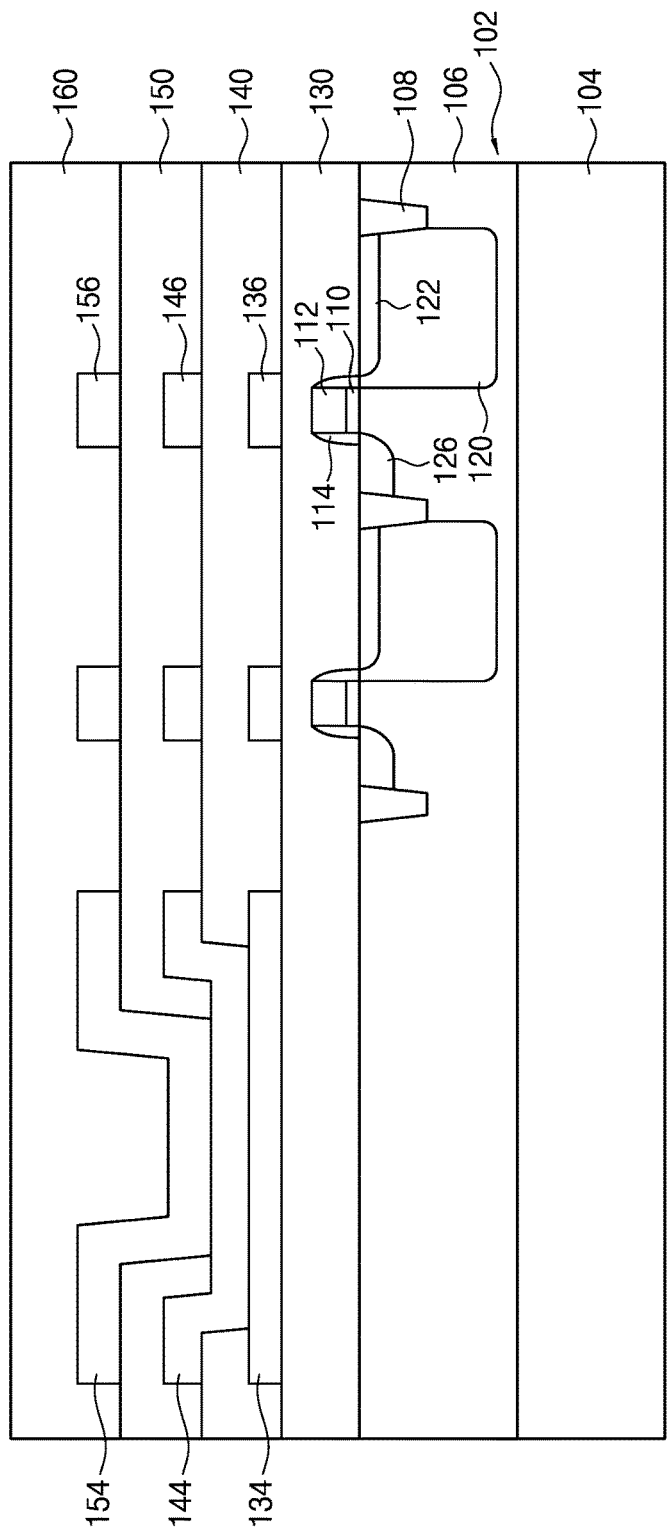

Referring to FIG. 10, a fourth insulating layer 160 may be formed on the third insulating layer 150, the third bonding pad 154, and the third metal wiring layer 156. Thus, the third bonding pad 154 may be stably supported by the third and fourth insulating layers 150 and 160. As a result, the first, second and third bonding pads 134, 144 and 154 may be in direct contact with one another as shown in FIG. 10, and further the edge portions of the first, second and third bonding pads 134, 144 and 154 are strongly supported by the first, second, third and fourth insulating layers 130, 140, 150 and 160. This support can inhibit damage to or peeling of off the first bonding pad from the substrate 102 during the wire bonding process.

Figure 11:
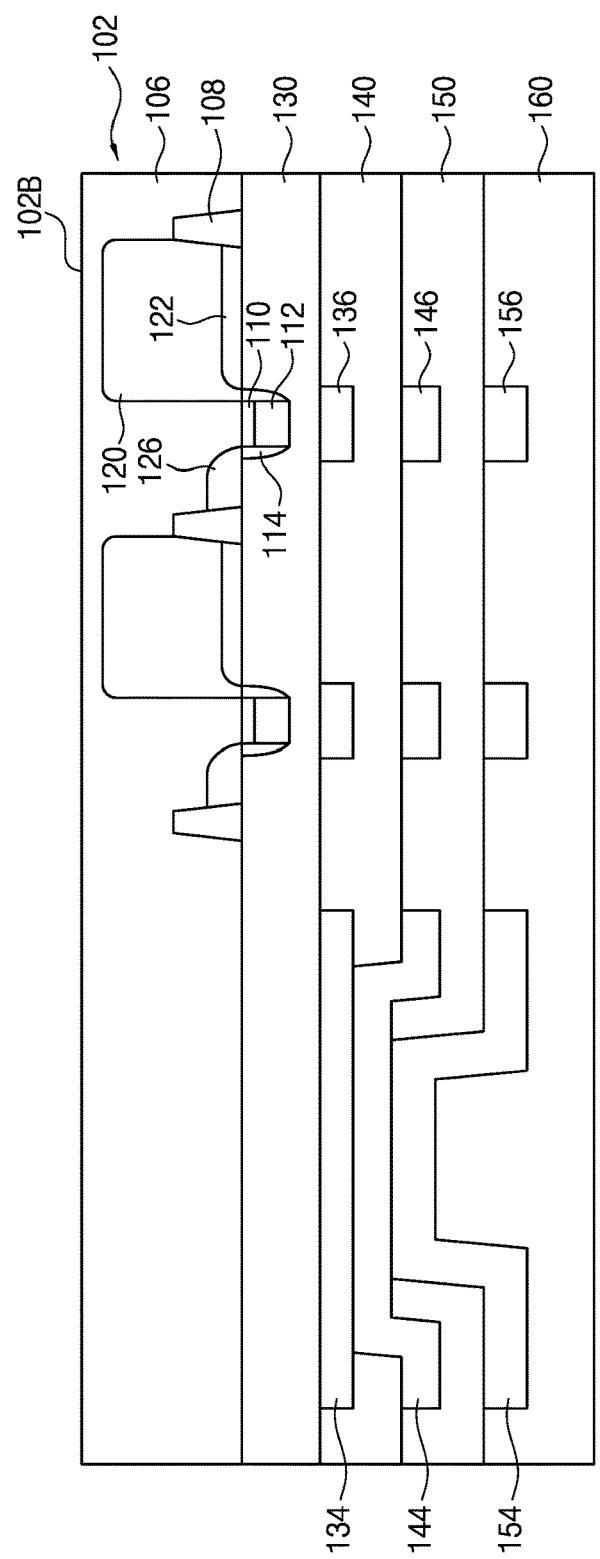

Referring to FIG. 11, a back-grinding process or a chemical and mechanical polishing process may be performed in order to reduce the thickness of the substrate 102. For example, the bulk silicon substrate 104 may be removed by a back-grinding process. After performing the back-grinding process, a wet etching process may be performed to remove contaminants from the back surface 102B of the substrate 102.

Figure 12:
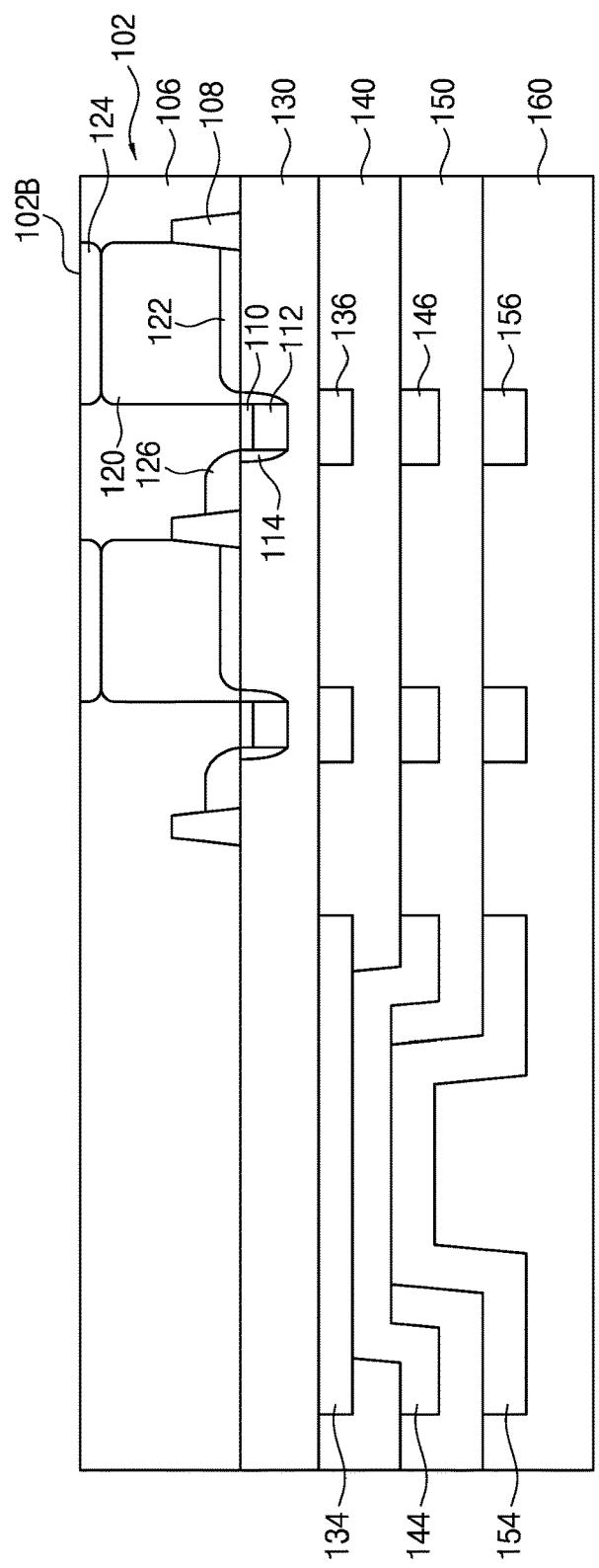

Referring to FIG. 12, the back pinning layer 124 having the first conductivity type may be formed between the back surface 102B of the substrate 102 and the photodiode 120. For example, the back pinning layer 124 can comprise a p-type impurity region that may be formed by an ion implantation process, and may then be activated by a laser annealing process.

Alternatively, the back pinning layer 124 may be formed prior to the photodiode 120. For example, after forming the back pinning layer 124 the photodiode 120 may be formed on the back pinning layer 124. The front pinning layer 122 may then be formed on the photodiode 120. In such a case, the back pinning layer 124 may be activated by a rapid heat treatment process at the same time as the photodiode 120 and the front pinning layer 122.

Figure 13:
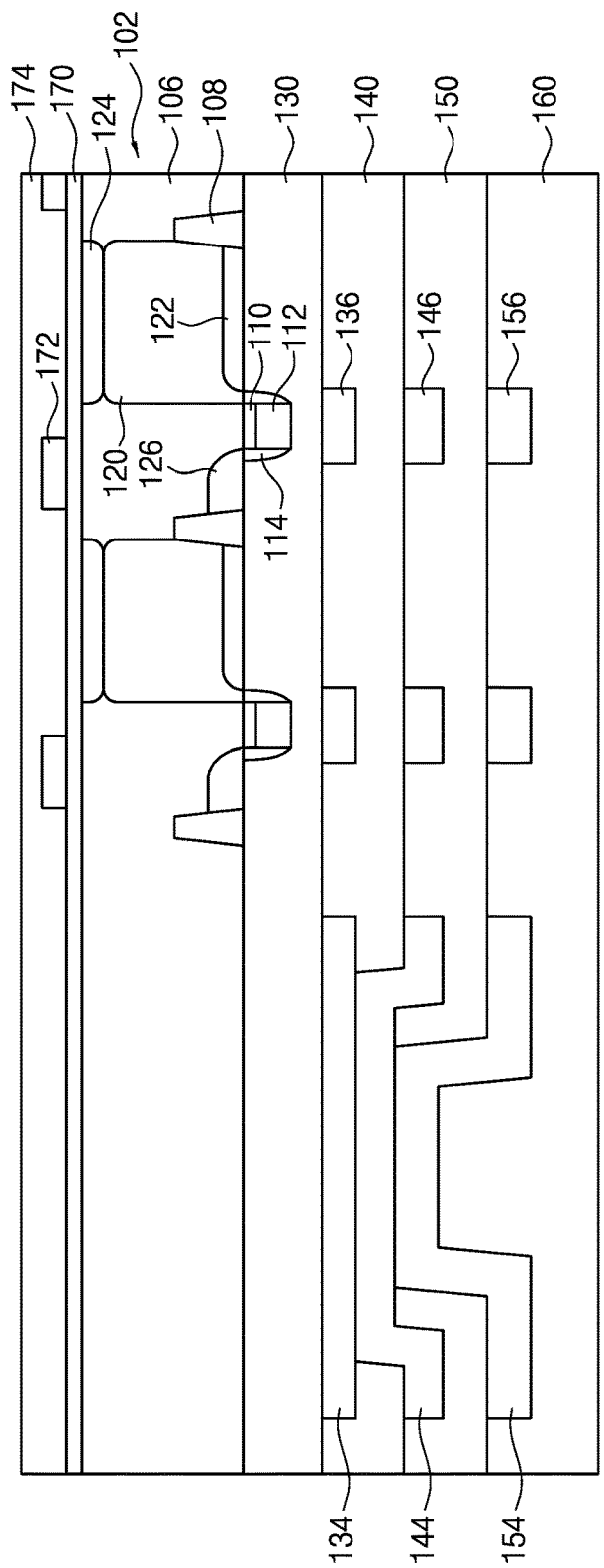

Referring to FIG. 13, the anti-reflective layer 170 may be formed on the back surface 102B of the substrate 102, and a light-blocking pattern 172 may be formed on the anti-reflective layer 170. In embodiments, the anti-reflective layer 170 may be made of a silicon nitride, and the light-blocking pattern 172 may be made of a metal such as tungsten (W). The light-blocking pattern 172 may be disposed between the photodiodes 120 as shown in FIG. 13 so as to reduce the cross-talk of the backside illuminated image sensor 100.

Further, the passivation layer 174 may be formed on the anti-reflective layer 170 and the light-blocking pattern 172. The passivation layer 174 may be made of a silicon oxide, a silicon nitride, a silicon oxynitride, and the like, and may function as a planarization layer.

Figure 14:
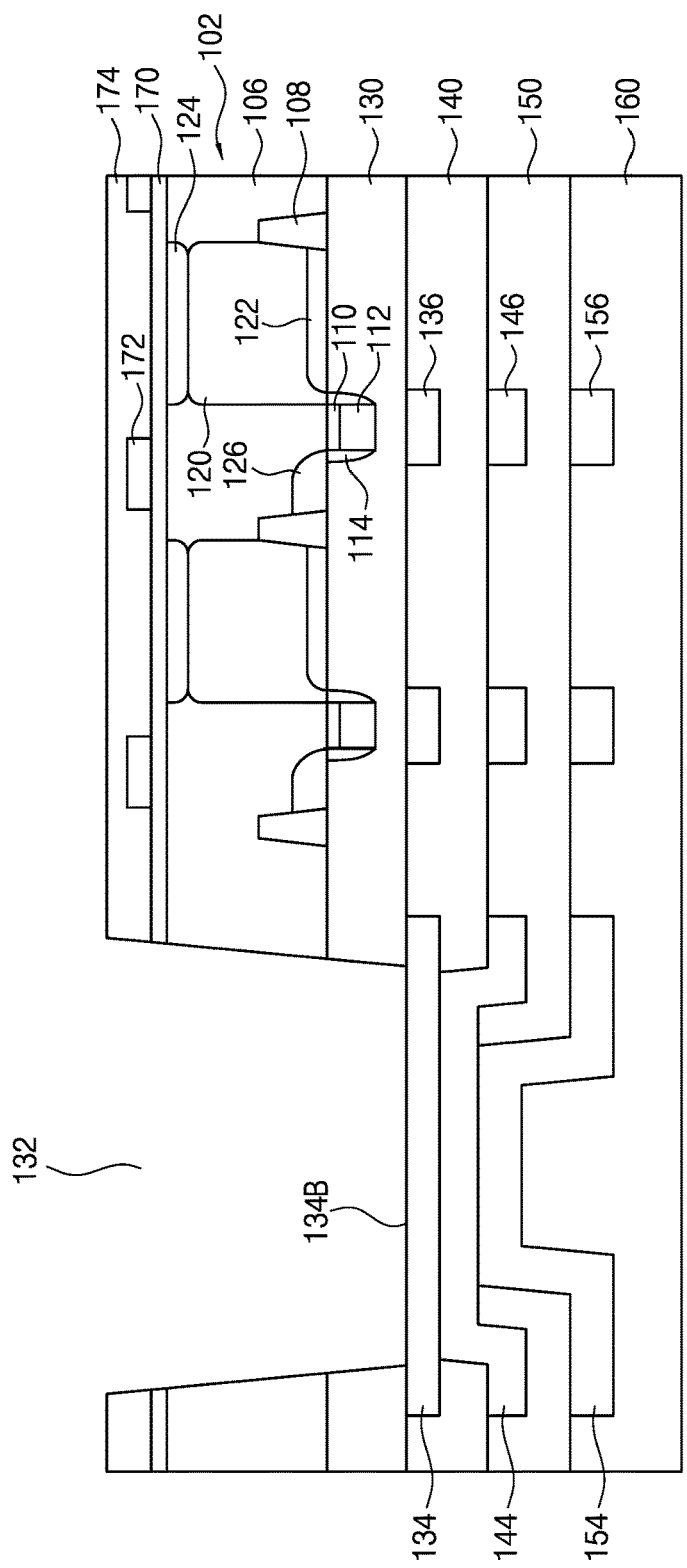

Referring to FIG. 14, the passivation layer 174, the anti-reflective layer 170, the substrate 102 and the first insulating layer 130 may be partially removed by a reactive ion etching (RIE) process so as to form the first opening 132, partially exposing a back surface 134B of the first bonding pad 134.

Figure 15:
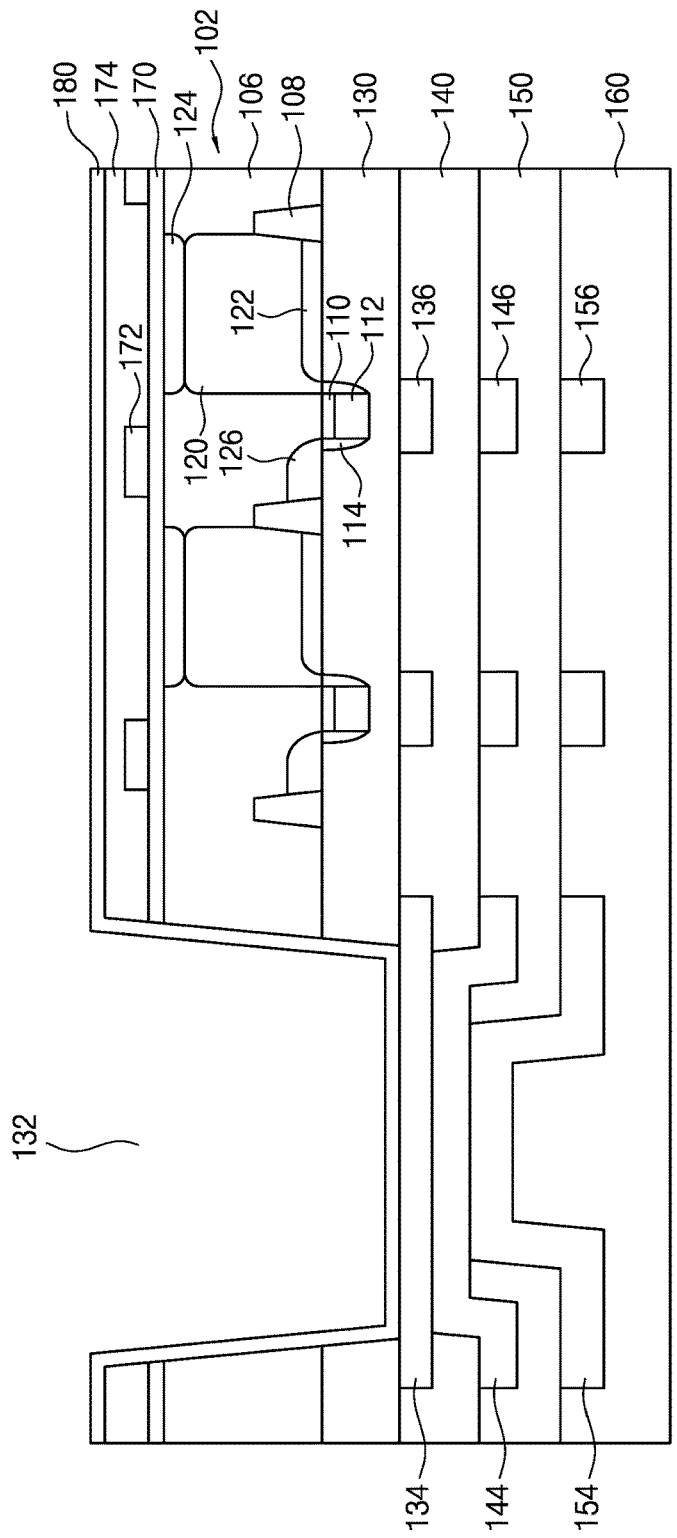

Referring to FIG. 15, a fifth insulating layer 180 may be conformally formed on the passivation layer 174, the inner surfaces of the first opening 132, and the back portion of the first bonding pad 134 that is exposed by the first opening 132. In embodiments, the fifth insulating layer 180 may be a silicon oxide layer or a silicon nitride layer formed by a chemical vapor deposition (CVD) process.

Figure 16:
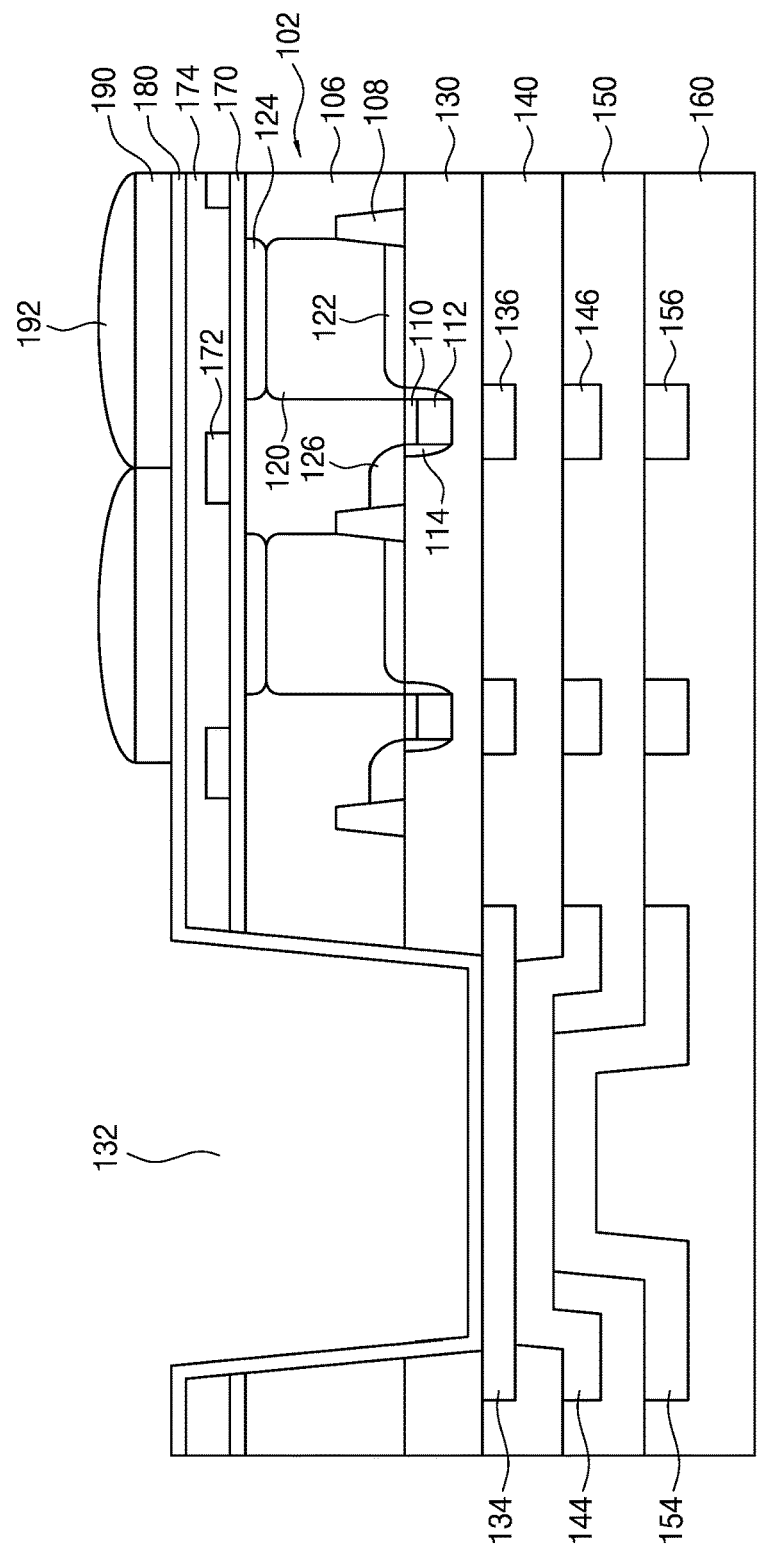

Referring to FIG. 16, a color filter 190 and a micro lens 192 may be sequentially formed on the fifth insulating layer 180. At this time, the fifth insulating layer 180 may function as a protective layer that can provide protection for the first bonding pad 134 while the color filter 190 and the micro lens 192 are formed.

After the formation of the color filter 190 and the micro lens 192, a portion of the fifth insulating layer 180 may be removed so that the back portion of the first bonding pad 134 is exposed through the first opening 132 as shown in FIG. 1. Then, a wire may be bonded to the back portion of the first bonding pad 134 or a solder ball or bump may be formed onto the back portion of the first bonding pad 134.

Alternatively, the first opening 132 may be formed after forming the color filter 190 and the micro lens 192. In such a case, the forming the fifth insulating layer 180 may be omitted.

In accordance with the exemplary embodiments of the present disclosure as described above, a backside illuminated image sensor 100 may include a photodiode 120 formed in a substrate 102, a first insulating layer 130 formed on a front surface 102A of the substrate 102, and a first bonding pad 134 formed on the first insulating layer 130. A back surface 134B of the first bonding pad 134 may be partially exposed by a first opening 132 passing through the substrate 102 and the first insulating layer 130.

A second insulating layer 140 having a second opening 142 partially exposing a front surface 134A of the first bonding pad 134 may be formed on the first insulating layer 130 and the first bonding pad 134, and a second bonding pad 144 may be formed on a front portion of the first bonding pad 134 exposed by the second opening 142 and the second insulating layer 140. Further, a third insulating layer 150 having a third opening 152 partially exposing the second bonding pad 144 may be formed on the second insulating layer 140 and the second bonding pad 144, and a third bonding pad 154 may be formed on a portion of the second bonding pad 144 exposed by the third opening 152 and the third insulating layer 150. Still further, a fourth insulating layer 160 may be formed on the third insulating layer 150 and the third bonding pad 154.

As a result, the first, second and third bonding pads 134, 144 and 154 may be connected with one another, and edge portions of the first, second and third bonding pads 134, 144 and 154 may be stably supported by the first, second, third and fourth insulating layers 130, 140, 150 and 160. Thus, the first bonding pad 134 may be prevented from being damaged or peeled away from the substrate 102 when a wire is bonded onto the backside portion of the first bonding pad 134 exposed by the first opening 132.

Although the backside illuminated image sensor 100 and the method of manufacturing the same have been described with reference to specific embodiments, they are not limited thereto. Therefore, it will be readily understood by those skilled in the art that various modifications and changes can be made thereto without departing from the spirit and scope of the present disclosure defined by the appended claims.

The invention claimed is:
1. A backside illuminated image sensor comprising:
a substrate having a front surface and a back surface;
a photodiode disposed in the substrate;

a first insulating layer disposed on the front surface of the substrate;

a first bonding pad disposed on a front surface of the first insulating layer;

a metal wiring layer disposed on the front surface of the first insulating layer;

a second insulating layer disposed on the front surface of the first insulating layer, the bonding pad and the metal wiring layer, and having an aperture extending from a front surface of the second insulating layer to the first bonding pad, such that a portion of a front surface of the first bonding pad is exposed; and a second bonding pad disposed in part on the portion of the front surface of the first bonding pad exposed by the aperture of the second insulating layer, and in part on the front surface of second insulating layer, wherein the substrate and the first insulating layer comprise structures defining an opening that partially exposes a back surface of the first bonding pad, and the first bonding pad comprises the same material as the metal wiring layer.

2. The backside illuminated image sensor of claim 1, wherein an edge portion of the first bonding pad is disposed between the first insulating layer and the second insulating layer.

3. The backside illuminated image sensor of claim 1, further comprising:

a second metal wiring layer disposed on the front surface of the second insulating layer, wherein the second bonding pad comprises the same material as the second metal wiring layer.

4. The backside illuminated image sensor of claim 3, further comprising:

a third insulating layer disposed on the front surface of the second insulating layer, the second bonding pad and the second metal wiring layer and having an aperture extending from a front surface of the third insulating layer to the second bonding pad, such that a portion of a front surface of the second bonding pad is exposed; and a third bonding pad disposed in part on the portion of the second bonding pad exposed by the aperture of the third insulating layer and in part on the front surface of third insulating layer.

5. The backside illuminated image sensor of claim 4, further comprising:

a third metal wiring layer disposed on the front surface of the third insulating layer; and a fourth insulating layer disposed on the front surface of the third insulating layer, the third bonding pad and the third metal wiring layer, wherein the third bonding pad comprises the material as the third metal wiring layer.

6. The backside illuminated image sensor of claim 1, wherein:

the substrate has a first conductivity type; and the photodiode has a second conductivity type; and further comprising a front pinning layer having the first conductivity type disposed between the front surface of the substrate and the photodiode.

7. The backside illuminated image sensor of claim 6, further comprising:

a back pinning layer having the first conductivity type disposed between the back surface of the substrate and the photodiode.

8. The backside illuminated image sensor of claim 1, further comprising:

a color filter disposed on a back surface of the substrate; and a micro lens disposed on the color filter.

9. The backside illuminated image sensor of claim 1, further comprising:

an anti-reflective layer disposed on the back surface of the substrate;

a light-blocking pattern disposed on the anti-reflective layer;

a passivation layer disposed on the anti-reflective layer and the light-blocking pattern;

a color filter disposed on the passivation layer; and a micro lens disposed on the color filter;

wherein the anti-reflective layer and the passivation layer comprise structures defining the opening.

10. The backside illuminated image sensor of claim 9, further comprising:

a fifth insulating layer disposed between the color filter and the passivation layer.

11. A method of manufacturing a backside illuminated image sensor, the method comprising:

forming a photodiode in a substrate;

forming a first insulating layer on a front surface of the substrate;

forming a first bonding pad on the first insulating layer;

forming a first metal wiring layer on the first insulating layer; and forming an opening passing through the substrate and the insulating layer such that a portion of the first bonding pad is exposed, wherein the first bonding pad is formed simultaneously with the first metal wiring layer.

12. The method of claim 11, further comprising:

forming a second insulating layer on the first insulating layer, the first bonding pad and the first metal wiring layer, forming an aperture through the second insulating layer such that a portion of the first bonding pad is partially exposed;

forming a second bonding pad in part on the exposed portion of the first bonding pad and in part on the second insulating layer; and forming a second metal wiring layer on the second insulating layer.

13. The method of claim 12, further comprising:

forming a third insulating layer on the second insulating layer, the second bonding pad and the second metal wiring layer;

forming an aperture through the third insulating layer such that a portion of the second bonding pad is exposed;

forming a third bonding pad in part on the exposed portion of the second bonding pad and in part on the third insulating layer; and forming a third metal wiring layer on the third insulating layer.

14. The method of claim 11, further comprising:

forming an anti-reflective layer on a back surface of the substrate;

forming a light-blocking pattern on the anti-reflective layer; and forming a passivation layer on the anti-reflective layer and the light-blocking pattern;

wherein the opening is formed through the passivation layer and the anti-reflective layer.

15. The method of claim 14, further comprising:
forming a protective layer on the passivation layer, inner surfaces of the opening and the exposed portion of the first bonding pad.

16. The method of claim 15, further comprising:
forming a color filter on the protective layer;
forming a micro lens on the color filter; and
removing a portion of the protective layer to expose the portion of the first bonding pad through the opening.

17. The method of claim 14, further comprising:
forming a color filter on the passivation layer; and
forming a micro lens on the color filter,
wherein the opening is formed through the passivation layer and the anti-reflective layer after forming the micro lens.

* * * * *